United States Patent [19]

deVries et al.

[11] Patent Number: 5,047,262

[45] Date of Patent: Sep. 10, 1991

[54] APPARATUS AND METHOD FOR SELECTIVELY COATING PRINTED CIRCUIT PANELS

[75] Inventors: John H. deVries, St. Petersburg; Walter K. McCall, Belleair Beach, both of Fla.

[73] Assignee: Automate-Tech, St. Petersburg, Fla.

[21] Appl. No.: 568,072

[22] Filed: Aug. 16, 1990

Related U.S. Application Data

[63] Continuation-in-part of Ser. No. 131,962, Dec. 11, 1987, abandoned, and a continuation-in-part of Ser. No. 221,265, Jul. 19, 1988, abandoned.

[51] Int. Cl.$^5$ .............................................. C23C 26/00
[52] U.S. Cl. ........................................ 427/96; 118/64; 118/404; 118/410; 118/413
[58] Field of Search .............. 427/96; 118/64, 404, 118/410, 413

[56] References Cited

U.S. PATENT DOCUMENTS

| | | | |
|---|---|---|---|
| 4,030,640 | 6/1977 | Citrin et al. ........................ 222/207 |
| 4,088,801 | 5/1978 | Bolon ................................... 427/96 |
| 4,331,099 | 5/1982 | Töpfer ................................. 118/413 |
| 4,465,014 | 8/1984 | Bajka et al. ......................... 118/114 |
| 4,493,857 | 1/1985 | Knigge et al. ...................... 427/96 |
| 4,563,974 | 1/1986 | Price .................................... 118/66 |
| 4,608,941 | 9/1986 | Morris ................................. 118/63 |
| 4,695,482 | 9/1987 | Weiswurm ........................... 427/96 |

Primary Examiner—Shrive P. Beck
Assistant Examiner—Vi Duong Dang
Attorney, Agent, or Firm—Herbert W. Larson

[57] ABSTRACT

A printed circuit panel is selectively coated to protect circuits which may be exposed to deleterious chemicals during the electroplating of connector tabs. The apparatus has a mechanism for gripping and transporting the circuit panels through multiple stations including cleaning, drying, coating and curing in a vertical position at variable speeds. The coating station has multiple wipers movable in a vertical plane to apply a polymer to the circuit panel at a controlled volume on various levels. The wipers each have a leading edge in contact with the panel surface to be coated and an adjustable back edge spaced apart from the panel surface to be coated with the polymer flowing to the panel between the two edges.

15 Claims, 9 Drawing Sheets

APPARATUS AND METHOD FOR SELECTIVELY COATING PRINTED CIRCUIT PANELS

PRIOR APPLICATION

This is a continuation-in-part of application Ser. No. 131,962, filed Dec. 11, 1987, (now abandoned) and Ser. No. 221,265, filed July 19, 1988 now abandoned.

TECHNICAL FIELD

This invention relates to an apparatus and method for selectively coating printed circuit panels. More particularly, it refers to an automatic apparatus that cleans and coats selective areas of a printed circuit panel and then cures the aforementioned coating.

BACKGROUND ART

Machines exist to apply various coatings to printed circuit panels. The most common are machines to apply solder to printed circuit panels as set forth in U.S. Pat. Nos. 4,465,014; 4,563,974 and 4,608,941. Various masking techniques are also known to print circuits on printed circuit panels.

Printed circuit panels with multiple electrical circuits interconnecting to other printed circuit panels or to components outside the panel require a number of electroplated connector tabs, or fingers, to be provided as part of the overall panel. These connector tabs, usually located at the edge of the panel, insert into a multi-lead female connector, either (1) mounted to a corresponding printed circuit panel or (2) attached to an external component via a multi-conductor cable to provide electrical connection.

A thin layer of gold is electroplated onto these connector tabs during fabrication of the panel to provide maximum conductivity at the tab/connector interface. This is done after the panel's internal circuitry is complete and before its discrete components are mounted and soldered in place.

Circuit portions of the panel surrounding the tab areas must be masked during the electroplating of gold to prevent damage from the chemicals used and to confine gold deposition only to the tabs themselves. Selective manual application of a specially formulated and expensive plater's tape is at present the primary means of accomplishing the tab masking.

When all of the tab groups on a panel are placed in-line along one edge of the panel, masking the circuit area surrounding these groups can be done by applying a continuous strip of thin pressure-sensitive tape along the common top edge of the tab area. However, connector tabs are grouped and spaced differently on different printed circuit panels and often are recessed from the panel edge, thereby complicating the application of plater's tape. Such tape must then be applied in multiple strips along the panel edge and may require patching small pieces of tape to the circuit areas around recessed tab groups. When taping is completed, the panels are run between high pressure rollers to insure maximum adhesion of the tape to both front and back panel surfaces and maximum conformance to the irregularities produced by circuit traces.

After gold plating the connector tabs, the tape is removed by hand using a razor blade, knife or other tool and the panel edges are chemically cleaned to remove all residue of tape adhesive. The entire manual taping-/detaping operation is tedious, time consuming and labor intensive. A method is needed to eliminate this time consuming step and accelerate the masking process.

SUMMARY OF THE INVENTION

We have invented an apparatus and a method which replaces the manual operation of taping and eliminates the need for the tape itself. Our proposed method automatically applies and then cures a liquid coating to the areas of a printed circuit panel surrounding the connector tabs in order to (1) protect these areas from the effects of chemicals used during electroplating and (2) confine gold deposition only to the connector tab surfaces.

Our apparatus employs a means attached to a frame for gripping and transporting at variable speeds a circuit panel through a series of stations. A panel loading guide attached to the frame positions the circuit panel in a proper vertical position prior to movement through the various stations. The stations provided are a degreasing, a rinse, a surface preparation station, a second rinse station, a drying station, a coating station and a curing station to set or harden the liquid coating following its application to the printed circuit panel. The tabs on the printed circuit panel can then be plated with gold or other precious metals in accordance with customary state-of-the-art recognized methods. The liquid coating applied then can be removed by using a caustic, or other stripping solution in accordance with customary state-of-the-art methods.

BRIEF DESCRIPTION OF THE DRAWINGS

The present invention may be best understood by those having ordinary skill in the art by reference to the following detailed description when considered in conjunction with the accompanying drawings in which.

BRIEF DESCRIPTION OF THE PREFERRED EMBODIMENT

A method of this invention produces the needed circuit panel in a masked condition by first cleaning those areas of the panel on which liquid coating is to be applied, and secondly applying liquid coating only to those areas surrounding the connector tabs and leaving the tabs uncoated. The applied liquid coating is cured, or hardened by exposing it to UV radiation or IR radiation, or by inducing solvent evaporation or by some other means depending on the type of liquid coating applied. The circuit boards can be treated on one side in a flat position or on both sides simultaneously in a vertical position. After electroplating, the applied liquid coating can be removed using an appropriate chemical.

Figure 1:
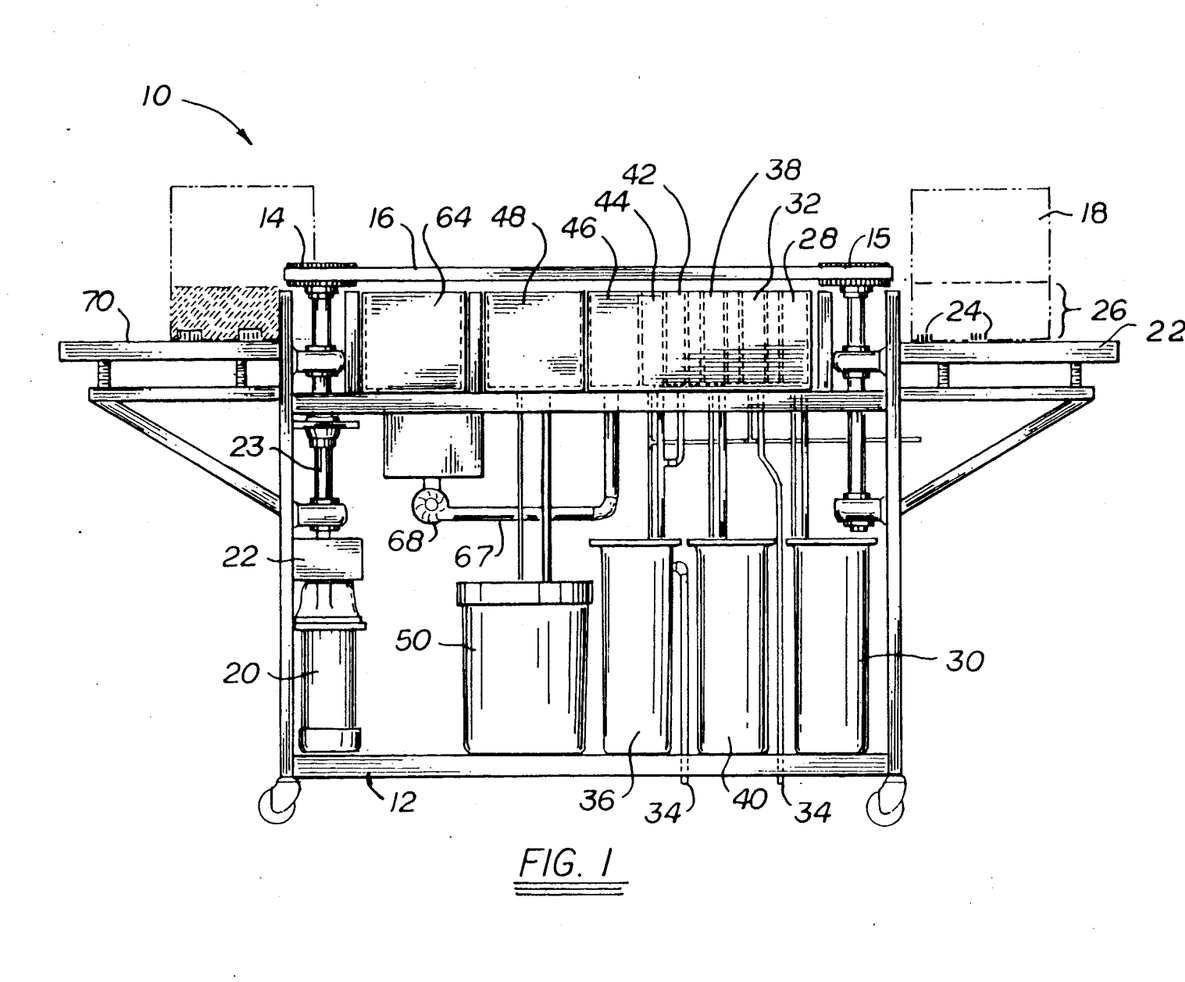
FIG. 1 is a schematic elevation view of the apparatus of the invention.
Figure 2A:
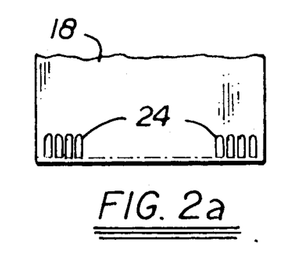
FIGS. 2a-c are partial side views of three printed circuit panels with tabs shown in varying positions.
Figure 2B:
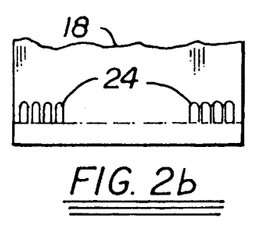
Figure 2C:
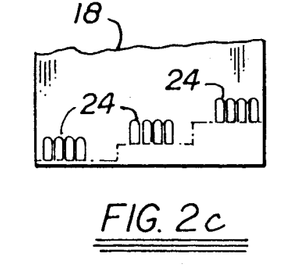

The apparatus 10 is shown in FIG. 1 mounted within a process module frame 12. The drive mechanism employed uses drive pulleys 14 around which resilient belts 16 travel and hold the printed circuit panel 18 in a vertical position between the resilient belts 16. The drive pulleys are attached to a motor 20 which has a gear reducer 21 and a shaft 23 driving the pulleys 14. Idler pulleys 15 are located at the opposite side of apparatus 10 from pulleys 14. A vertical loading guide 22 adjusts the vertical height of the printed circuit panel 18 as required in order to locate tabs 24 in a position which facilitates application of the liquid coating. The height to which the printed circuit panel will be coated 26 is also determined by adjusting the vertical position of the loading guide 22 prior to entering the apparatus' first process station.

The travel movement imparted to the printed circuit panel 18 can be accomplished by any suitable known conveying or transferring facility. The exact amount of time that the printed circuit panel 18 will remain in each process station is determined by the chemicals used at each process station and can be preset into the system by attaching the drive pulleys to a speed-control arrangement.

The panel passing through the various process stations is treated on both sides. The first station 28 is a degrease station containing a detergent or mild alkaline solution in a reservoir 30 beneath the degreaser station 28. The degrease solution from reservoir 30 is pumped to the degrease station 28. Thereafter, the printed circuit panel 18 is rinsed with water at station 32 and the waste water is routed to drain 34 or to a rinse water reservoir 36. After the rinse station 32 the printed circuit board panel 18 passes into a surface preparation station 38 which obtains solution from a reservoir 40. The solution in this reservoir will be an acidic cleaner such as mild hydrochloric acid. The time in which the panel remains within the surface preparation solution, or any other station, is determined by the length of the process station and the effective line speed of the transport mechanism.

After the surface preparation station 38 the panel moves through one or more rinse stations 42 and 44 which again evacuate the waste water through the rinse water reservoir 36 and drain 34. Other state-of-art cleaning methods can be used such as with bristle brushes or other chemical cleaners. Thereafter the panel 18 moves on to the drying station 46. The panel will remain in the drying station 46 until completely dry and will thereafter be ready for coating. The time in each degrease, surface preparation and rinse station should be sufficient to remove all surface contaminants from the panel. Usually, a time period in each such station of five to twenty seconds is adequate to obtain the desired cleaning.

The coating station 48 is fed from a liquid coating reservoir 50 containing a liquid polymer 92, such as acrylate based polymer, thermo setting plastic, or other industrial protective liquid coating. Preferred is a UV curable alkali-strippable, acrylate-based thixotropic plating resist. The coating station 48 has a series of pinch valves 52a, b, c, d controlling the flow of coating solution from reservoir 50 as seen on the left side of the panel 18 shown in FIG. 4. Since both sides of a panel are processed simultaneously, an identical set of pinch valves is located on the right side of the coating station 48 but not shown in FIG 4. Each valve controls the flow of coating solution liquid to a wiper 54a, b, c, d respectively containing a means for establishing the thickness of applied coating. One means is a draw downbar on the wiper having a gap of 1-7 mils. These wipers 54a through d are positioned at different levels so that among the four wipers 54a through d they will coat the area 26 on the printed circuit board 18 upon command. The commands are carried out through electrical signals to the linear actuators 56a through d respectively, which raise and lower the wipers 54a through 54d, thereby determining the actual coating patterns.

Figure 8:
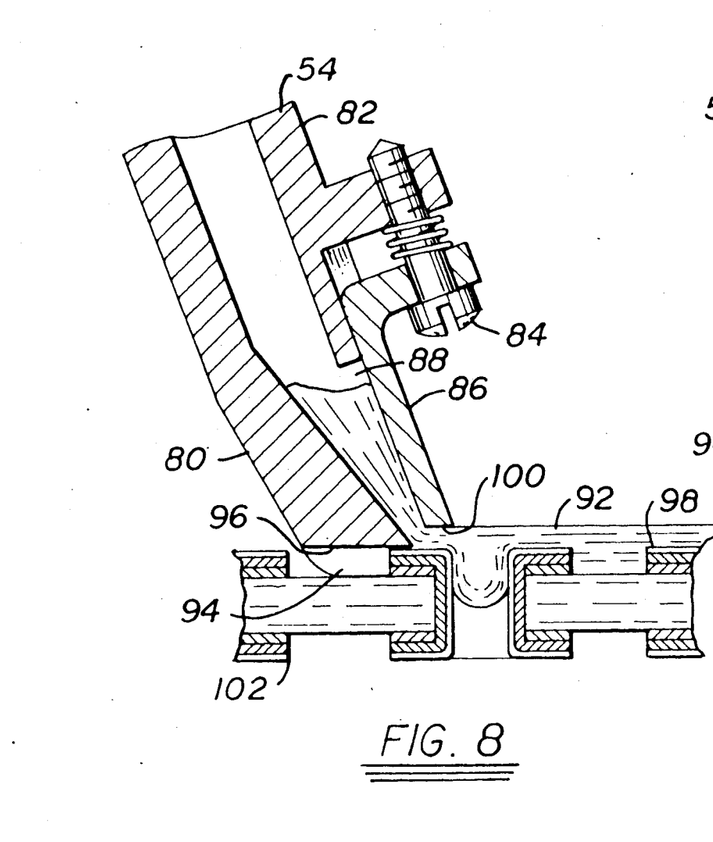
FIG. 8 is a side view in section of a wiper with polymer flowing between two bottom edges to a circuit panel.
Figure 9:
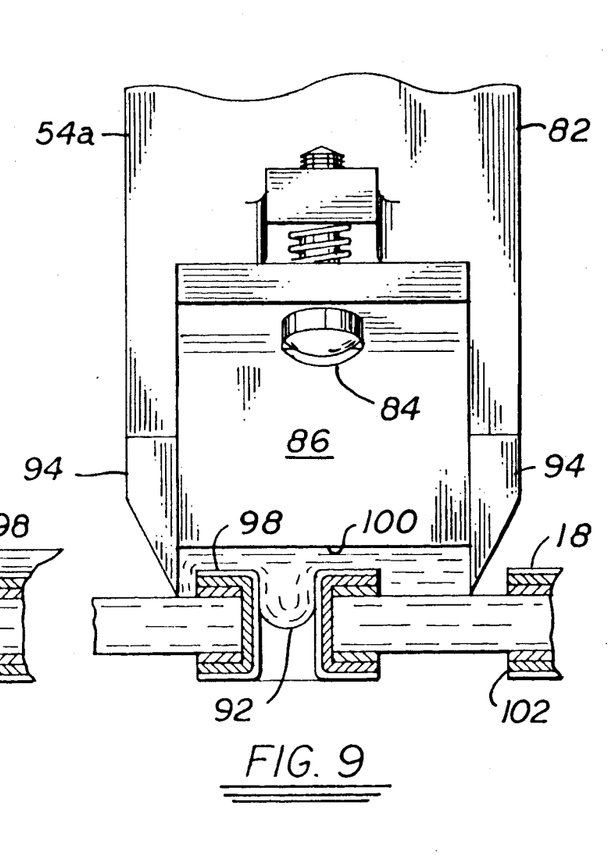
FIG. 9 is a rear view of a wiper applying polymer to a circuit panel.
Figure 10:
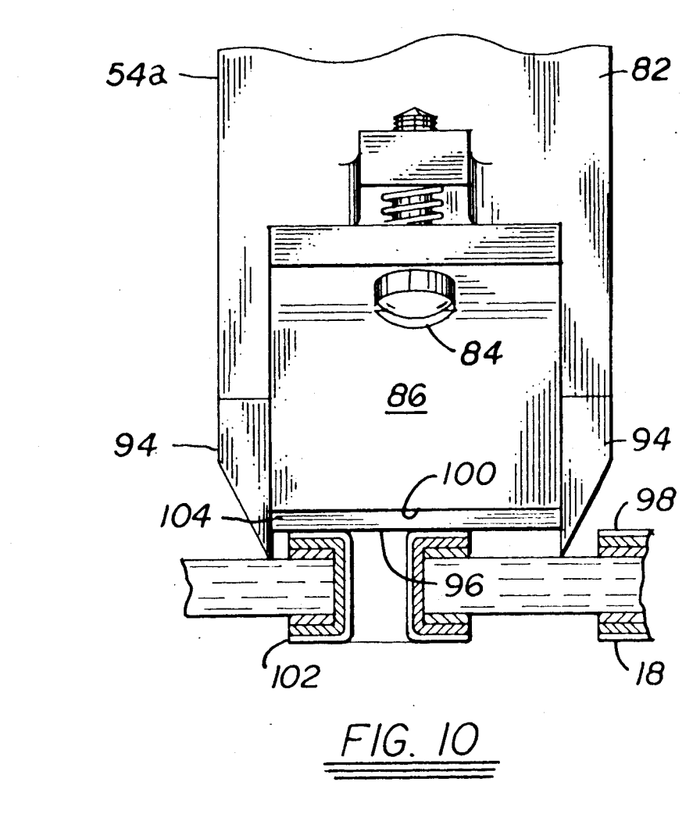
FIG. 10 is a rear view of a wiper without any flow of polymer.
Figure 11:
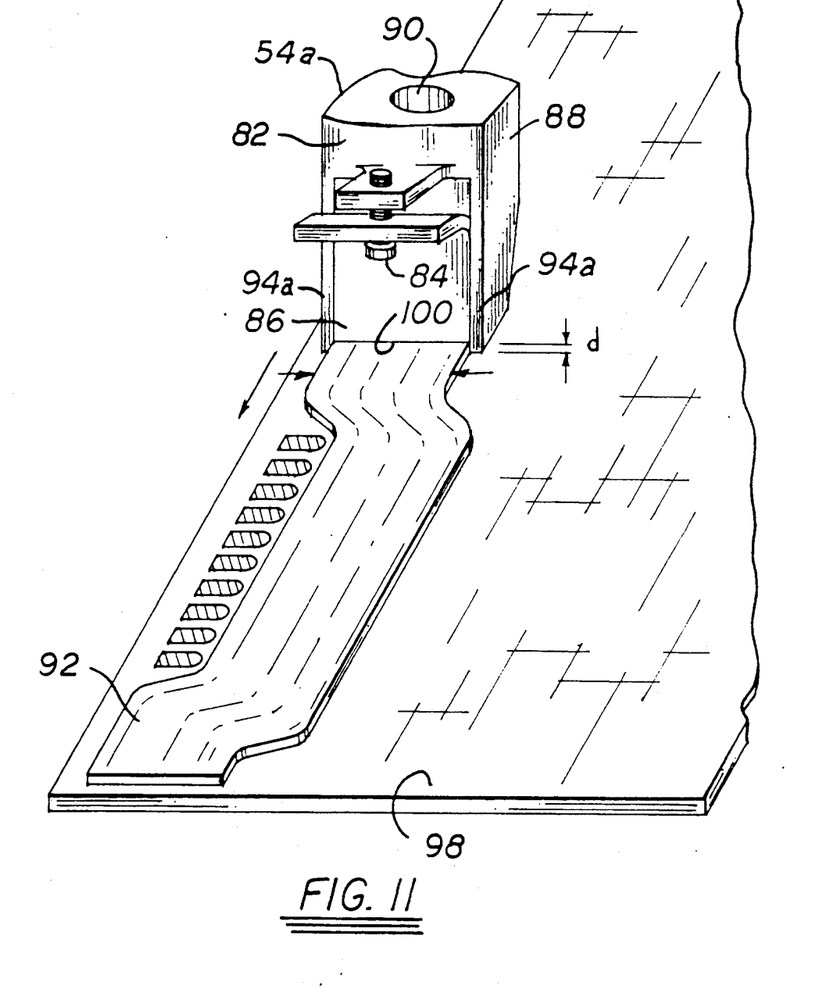
FIG. 11 is a perspective view of an alternate wiper placing a layer of polymer on a circuit panel.
Figure 12:
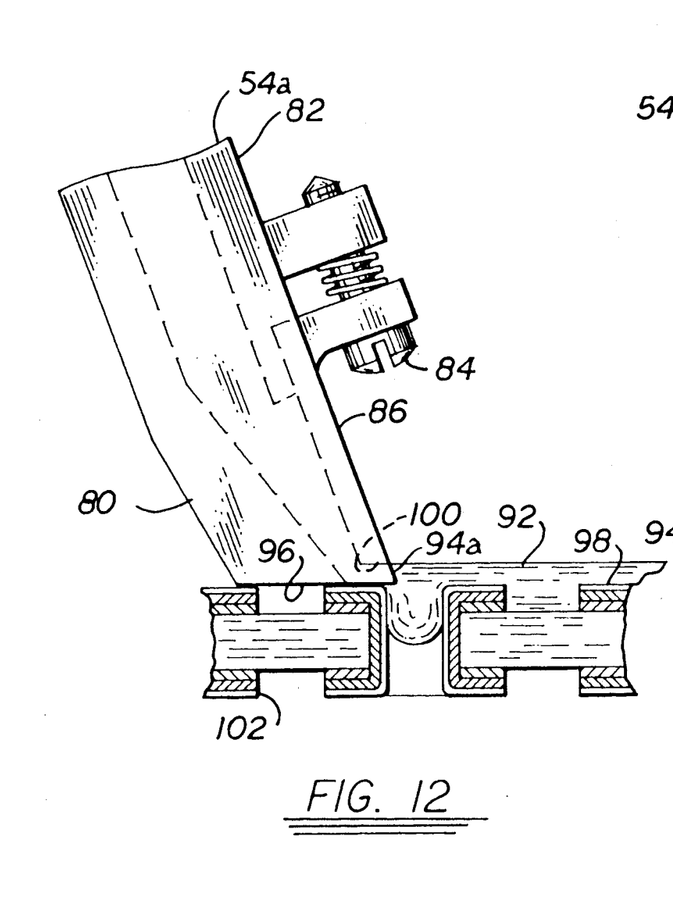
FIG. 12 is a side view of the alternate wiper with polymer flowing between the bottom edge of the back doctor blade.
Figure 13:
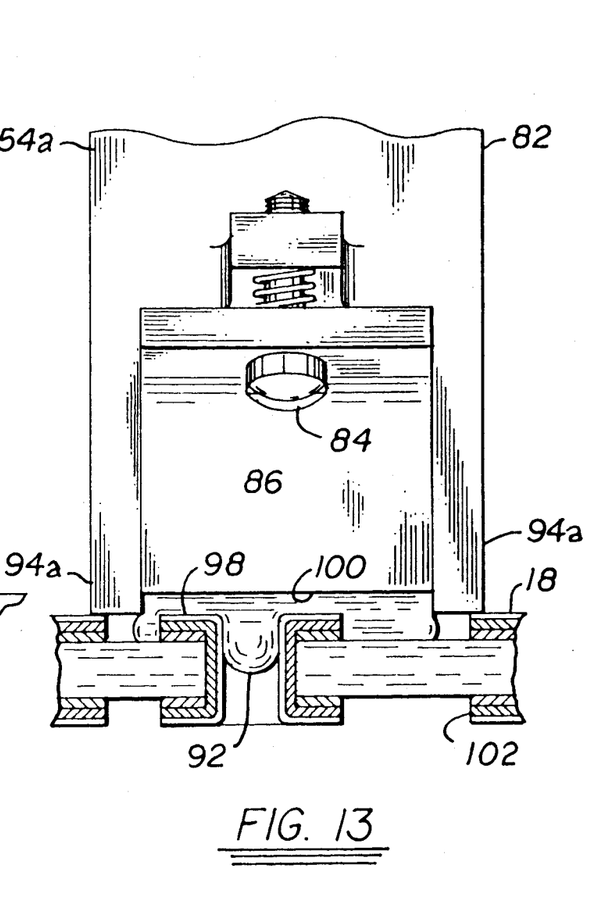
FIG. 13 is a rear view of the alternate wiper applying polymer to a circuit panel.
Figure 14:
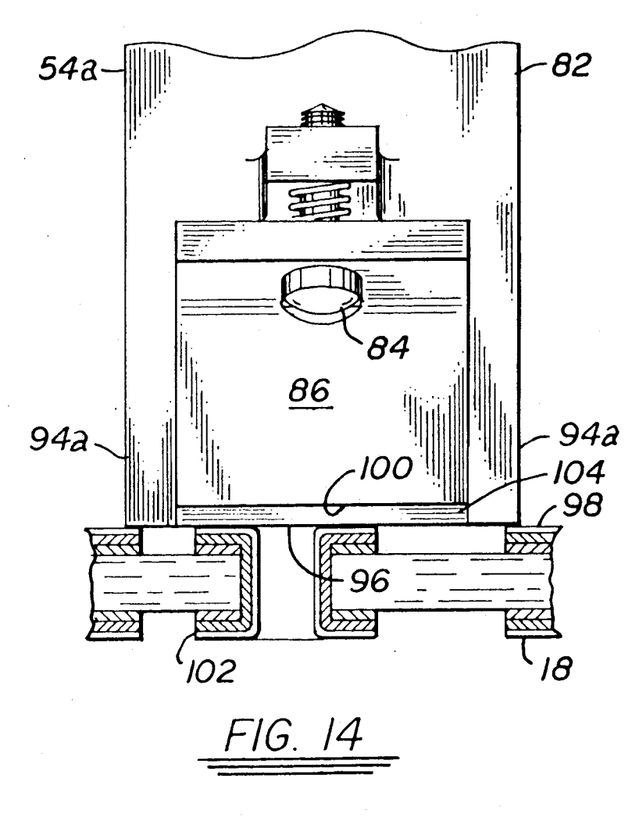
FIG. 14 is a rear view of the alternate wiper without any flow of polymer.

Each wiper 54a-d has a front housing wall 80 and a rear housing wall 82. An adjustment screw 84 connects a doctor blade 86 to the rear housing wall 82. Side walls 88 connect the front wall 80 to the rear wall 82. An annular opening 90 receives the liquid polymer 92 delivered through the pinch valve 52.

Each wiper 54a-d may have a pair of elastomeric squeegee end guards 94 mounted on each side of the bottom portion of the front housing wall 80 as shown in FIGS. 7-10. These end guards 94 project below the first edge 96 of the front wall 80. These end guards 94 are used when the top of the circuit panel is rough. Edge 96 is in constant contact with the top surface of circuit panel 18 while polymer is being applied and slides on top of the circuit panel traces 102. The difference in height between a second edge 100 on the doctor blade determines the thickness of the polymer coating 92 on the circuit panel surface 98. The end guards 94 extending below first edge 96 conform to the contour of the circuit trace 102 providing a complete seal on the sides of the polymer coating 92. Accordingly, clean side demarcation lines are established for the coating 92. Alteratively, as seen in FIGS. 11-14 the end guards 94a form an integral unit on each side with walls 88. These end guards 94a are made from the same material as wall 88 and can be aluminum, stainless steel or a high strength polymer. The polymer 92 flows through opening 104 between the bottom edges 96 and 100 when the wiper 54a is in operation.

The liquid coating reservoir 50 located below the coating station 48 has a removable lid 58 and a positive displacement pump 60 which pushes the coating solution into the valves 52a through d and then to the wipers 54a through d. A pressure regulator 61 connected to an air supply (not shown) controls the flow rate so that the liquid coating does not overload on the wipers 54 to such an extent that the liquid coating applied will run onto the tabs 24, or other areas not requiring coating. The pressure regulator 61 is subjected to an air pressure of 20-100 psi.

The coating can be applied to a distance up to four inches from the panel 18 outer edge, and over this entire area as well. The actual coating profile is conveyed by the machine's microprocessing controller based on operator input derived from the geometry of the panel and its tab locations.

Figure 3:
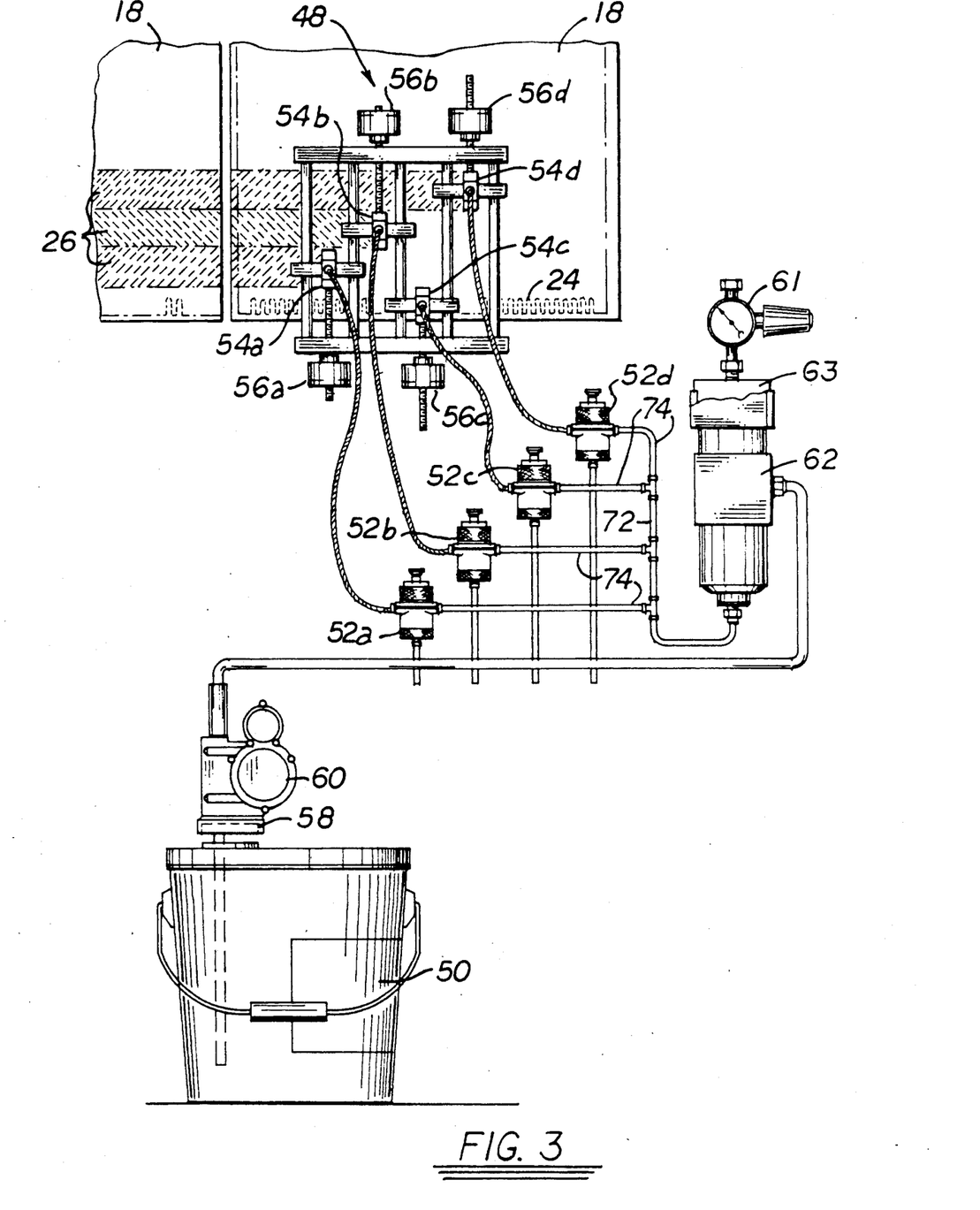
FIG. 3 is a left side view of the coating assembly station.

The pump 60 which can be any kind of positive displacement pump is activated automatically when the volume of polymer under pressure in the pressurized cartridge 63 reaches the lower limit as detected by the volume sensor 62 in the pressurized cartridge 63. The coating solution is pumped up to this cartridge 63 and by internal cartridge pressure is then supplied to the eight applicator wipers 54, four of which are shown in the drawings as 54a through d. The manifold 72 shown in FIG. 3 has a series of flexible delivery tubes 74. The manifold 72 allows one pressure cartridge 63 at a pressure of about 20-50 psi to supply coating solution from container 50 to each and all wipers 54a through d.

Figure 4:
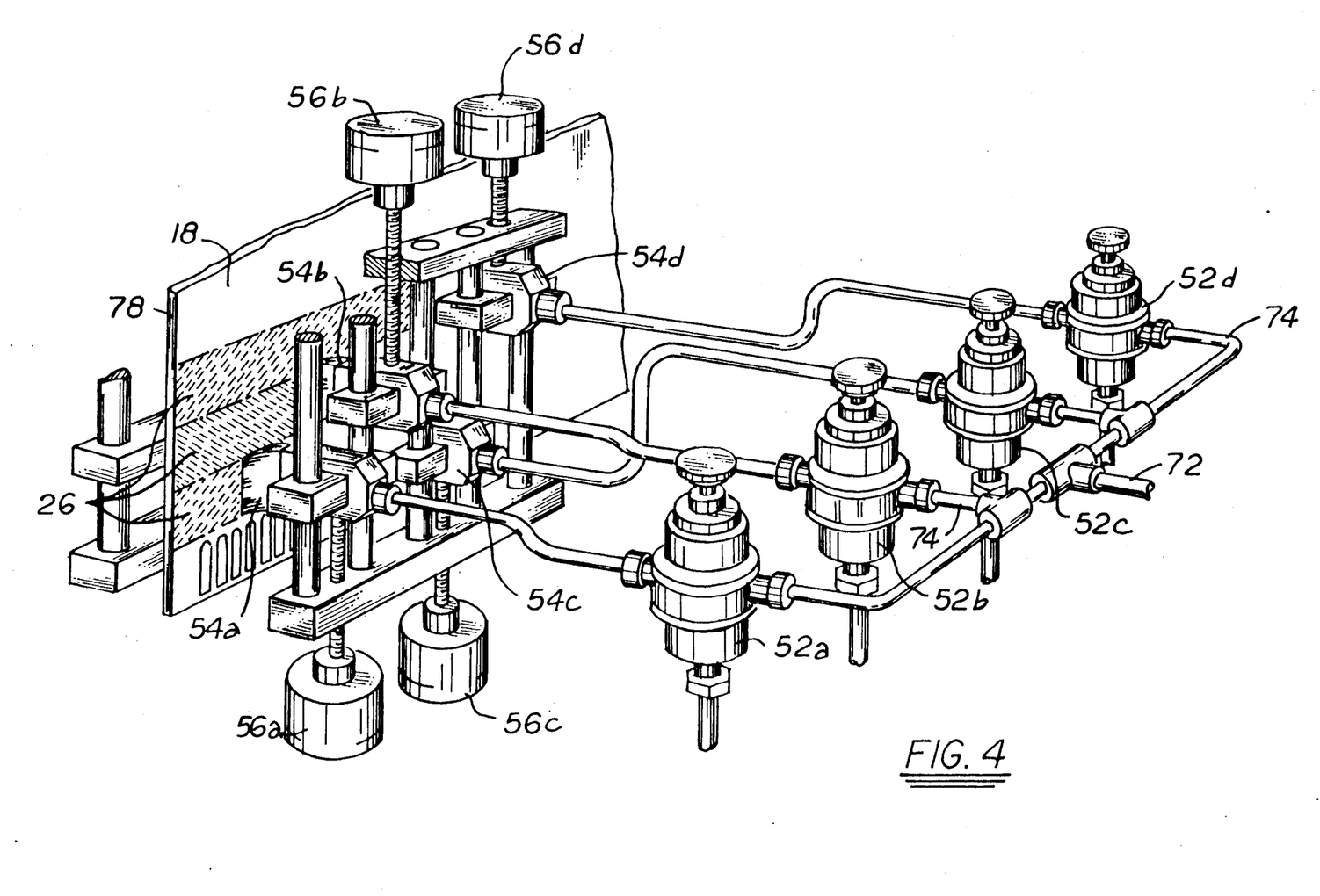
FIG. 4 is a perspective view of the application portion of the coating assembly station.

The flow of liquid polymer to each wiper 54a through d is controlled by independent pinch valves 52a through d which are located in line between the pressurized cartridge 63 and their respective applicator wipers 54a through d.

The viscosity of the liquid is controlled to insure that no running, dripping or tailing occurs when the flow is stopped. Likewise, the coating once applied does not move or slump on the vertical panel surfaces. Each of the applicators 54a, b, c and d can be positioned vertically so that any desired area 26 of the panel up to four inches from its edge can be covered by the coating solution while tabs 24 are left uncoated. Movement of each wiper 54 a distance of one-half inch up or down from a preset position is done by a connected linear actuator 56a through d. Such movement can occur while the panels 18 are moving horizontally and while the liquid coating is flowing.

Parameters representing panel 18 tab size, position and geometry are initially entered into the machine's microprocessor controller, not shown, via menu driven software prompts, or other data entry techniques. These parameters are translated by the microprocessor into data representing the number and 0 instantaneous position of the applicator wipers 54a through d required to provide the desired coating profile. Thus the wipers 54 are instructed by an electrical signal to move up or down in a vertical plane while the panels 18 are passing through the station 48 so that any pattern of circuit board tabs 24 is accommodated.

Data representing the position and operation of each wiper 54 is generated for each specific printed circuit panel 18 to be processed. Such encoded data are transmitted to the positioning actuator 56 associated with each wiper 54 by means of the microprocessor control. Based on sensing the leading vertical edge 78 of each panel 18 the sequence of instantaneous wiper positions will be repeated for each panel as it proceeds through the coating apparatus.

With modes of control for liquid flow and vertical nozzle position combined into an integrated coating application apparatus 10 as described herein it is possible to apply a liquid coating to identical predetermined areas 26 of successive panels of a like lot or series of panels. In addition, the apparatus 10, as commanded, can direct the coating station 48 to apply liquid coating to predetermined areas 26 of successive different panels 18.

Figure 5:
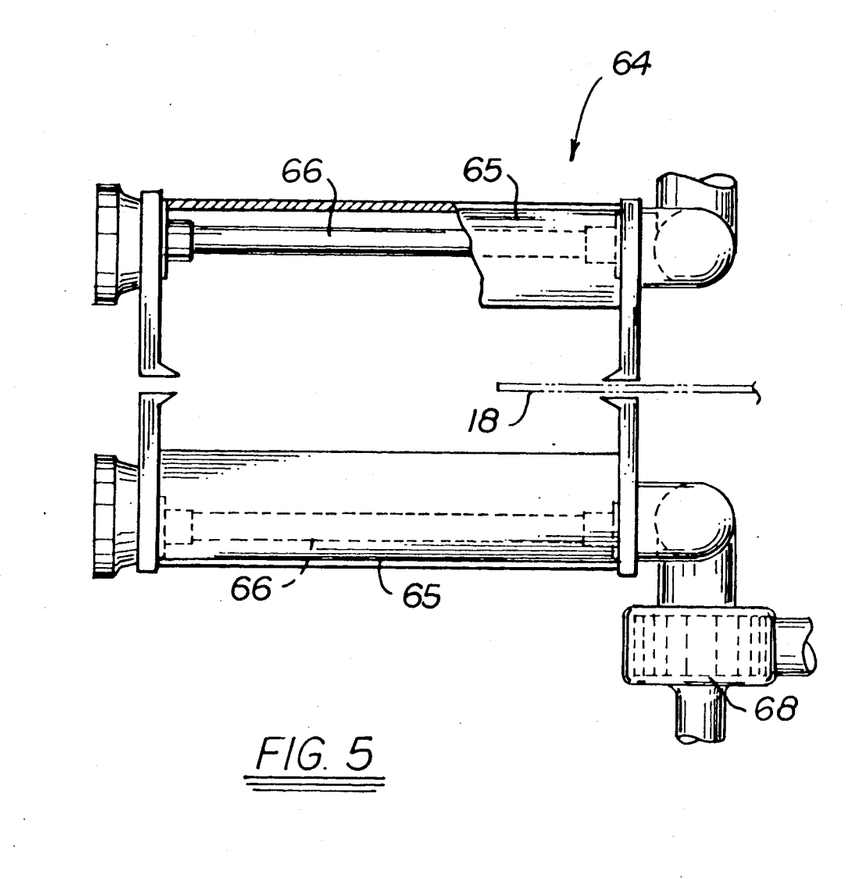
FIG. 5 is a top plan view of the curing station.
Figure 6:
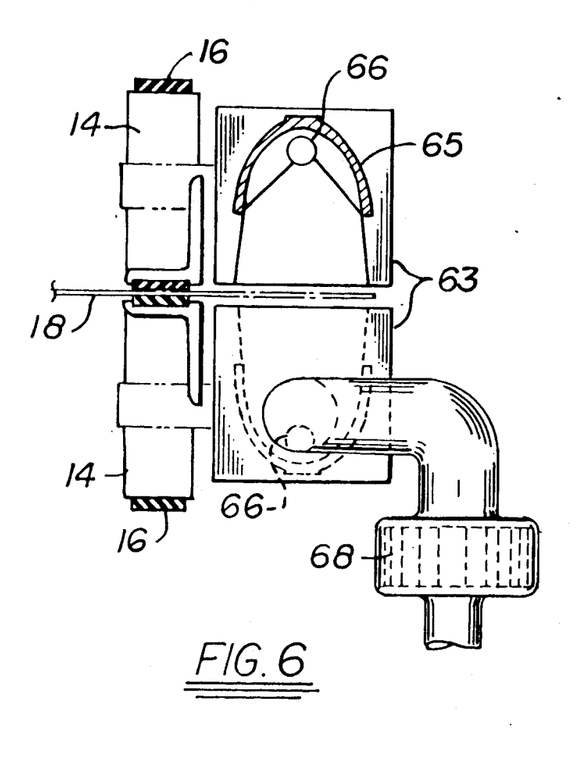
FIG. 6 is a section view of the curing station.
Figure 7:
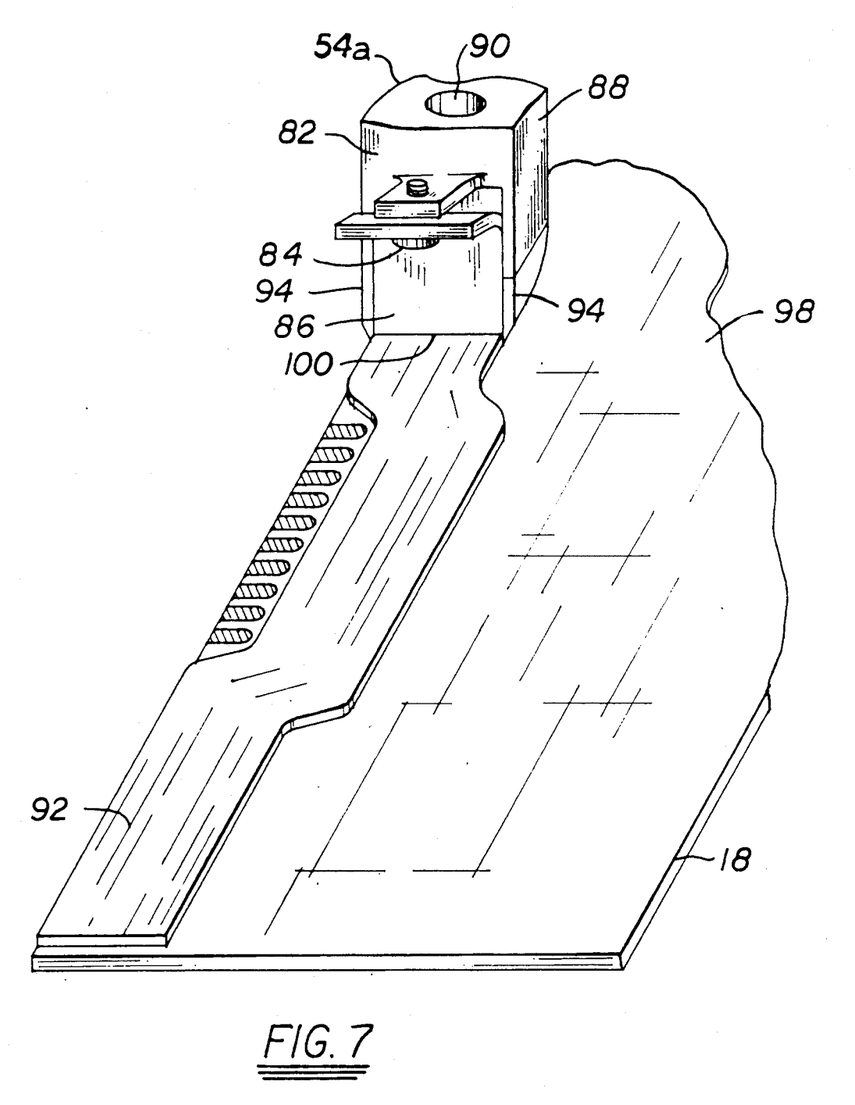
FIG. 7 is a perspective view of a wiper placing a layer of polymer on a circuit panel.

The curing or exposure station 64 cures or solidifies the liquid coating applied onto the panel area 26 surrounding all tab groupings 24. The coating solution can be cured, in addition to exposure by ultraviolet (UV) radiation, by exposure to infrared radiation, by solvent evaporation, or by other means depending on the type of coating applied. Exposure to ultraviolet radiation provides the shortest cure time and is therefore the preferred method.

The coating chemical can be, but is not limited to a liquid mixture of low molecular weight oligomers and monomers which cure to a solid polymerized structure when exposed to ultraviolet radiation in the 180 to 400 nanometer (Nm) wavelength range. Photochemical UV decomposition of photoinitiators within the liquid produce free radicals that react with the oligomers and monomers to produce a solid coating of cross linked polymers. The polymer coating thus cured will adhere to whatever substrate it is applied. The cured coating will be unaffected by the chemicals used in the electro plating process. Depending on the chemical makeup of the polymer, the curing reaction may be slow or it may occur very quickly. An acrylate based polymer cures within five to twenty seconds provided that it is applied to a thickness not more than 0.005 inches (5 mils.).

The curing station 64 consists of two sources of ultraviolet radiation 66 arranged next to the path of panel travel and juxtaposed with each other such that each coated panel passes between these identical irradiators and the coatings are cured during their exposure. Each irradiator has a linear source of UV radiation and embodies a parabolic reflector 65 which extends over the total length of the UV source.

The reflector 65 is configured to redirect UV energy which does not impinge directly on the coated surface of the panel. It includes a dichromic coating which transmits radiant energy in the infrared region of the spectrum and reflects radiant energy in the UV region. The purpose of this is to minimize heating of the panels, to extend the operating life of the UV source and to optimize the available UV energy. Both the UV lamps 66 and reflector 65 are assembled into an enclosure 63 which is configured to promote the free flow of air past the lamp 66 and its reflector 65. Baffles and shields are incorporated within each such enclosure to prevent unwanted UV radiation from reaching the eyes of anyone observing the apparatus while it is operation. A remote fan or blower 68 insures movement of cool air across the lamps during operation. The exhausted air then provides heated air through duct 67 for the dryer 46.

After curing the liquid coating, the panel 18 is moved onto the unloading guide 70 to await transport to a plating station. The uncoated tabs will then be plated with gold or some other non-corrosive conductive metal in a state of the art plating apparatus. After the gold is plated on the tabs the coating can be removed by standard washing procedures employing highly caustic stripping solutions such as sodium hydroxide.

The chemical strip function does not require a proprietary or unique equipment. Instead, this chemical strip can be done by any variety of existing processing means whether manual or automatic. However it is performed, stripping of the cured coating represents a substantial time and labor savings over the removal of tape manually.

Although the device described herein is intended as an alternative to the manual application of plater's tape to printed circuit panels, the device is not limited to this application. The device can be used to apply any other type of coating or protective material, such as that used to cover the electroplated tabs during wave soldering, conformal coating and hydro squeegee.

Having thus described the invention, what is claimed as new and desired to be secured by Letters Patent is:

1. In a continuous automatic apparatus for coating circuit portions of a printed circuit panel having connector tabs, the apparatus having a device attached to a frame for gripping and transporting at variable speeds the circuit panel from station to an adjacent station, the stations including a pre-cleaning, drying, liquid coating and curing station and having an unloading guide at an exit end of the frame, the improvement comprising in the liquid coating station, having at least one wiper movable in a plane normal to the direction of movement of the circuit panel to apply a liquid coating to the panel at a pre-selected controlled volume in a plane parallel to the panel to selectively mask a portion of the panel, a first fixed edge of the wiper being in contact with the panel surface to be coated during a coating operation, a second adjustable edge forming a slot with the first fixed edge, the second edge being spaced apart from the panel surface to be coated to permit the liquid coating to flow from the wiper to the panel surface to be coated between the two edges, the first and second edges having a pair of contiguous end guards defining a first and second side of the first and second edges to prevent lateral spread of the liquid coating and a linear actuator receiving a signal adjusting the wiper to the preselected levels, the mask formed from the liquid coating, after curing, being a polymer readily removable by chemical treatment without damage to the circuit portions of the printed circuit panel.

2. An apparatus according to claim 1 wherein multiple wipers are located on one side of the circuit panel in the coating station.

3. An apparatus according to claim 1 wherein multiple wipers are located on each side of the circuit panel in the coating station.

4. An apparatus according to claim 3 wherein the linear actuator for each wiper is instructed by an electrical signal to continuously adjust the wiper as the printed circuit board passes through the coating station.

5. An apparatus according to claim 3 wherein each wiper in the coating station is fed the liquid coating through a pinch valve and a pressure regulator controls the flow of liquid coating volume to the pinch valve.

6. An apparatus according to claim 1 wherein the curing station has a pair of infrared lamps between which the printed circuit panel passes.

7. An apparatus according to claim 1 wherein the curing station has a pair of UV lamps between which the printed circuit panel passes.

8. Method of selectively masking circuit portions of a printed circuit panel having connector tabs comprising:
   (a) feeding a circuit panel between a pair of grippers in a vertical position;
   (b) aligning the vertical height of the circuit panel for passage through a series of treatment stations to clean the circuit portion of the circuit panel;
   (c) coating the circuit portion of the circuit panel on each side with a controlled volume flow of a liquid coating solution by at least one wiper on each side movable in a vertical plane in response to a signal, the wipers having a first fixed edge in contact with the panel surface to be coated and a second adjustable edge forming a slot with the first fixed edge, the second edge spaced apart from the panel surface to be coated, the liquid polymer flowing from the wiper between the first and second edge, the first edge and second edge of the wiper having a pair of continguous end guards defining a first and second side, the panel being coated with a defined strip of polymer while moving past the wipers; and thereafter
   (d) curing the coating solution to form a polymer.

9. A method according to claim 8 wherein the wipers move in response to an electrical signal up and down in the vertical plane to coat only the circuit portion while the circuit panel is passing between the wipers so that any configuration of circuit board tabs is accommodated.

10. A method according to claim 8 wherein vertical movement of the wipers is repeated on each successive printed circuit panel by input from a microprocessor control.

11. A method according to claim 8 wherein each wiper is fed coating solution through a pinch valve and a pressure regulator controls the flow of solution volume to the pinch valve.

12. A method according to claim 8 wherein the vertical movement of wipers is adjusted by a linear actuator receiving an electrical signal.

13. A method according to claim 8 wherein the liquid coating is an acrylate based pre-polymer.

14. A method according to claim 13 wherein the acrylate based pre-polymer is a UV curable alkali-strippable, thixotropic plating resist.

15. A method according to claim 8 wherein the circuit panel is coated on each side by multiple wipers.

* * * * *